United States Patent
De Caro et al.

(10) Patent No.: US 9,483,108 B2
(45) Date of Patent: *Nov. 1, 2016

(54) ULTRA-DEEP POWER-DOWN MODE FOR MEMORY DEVICES

(71) Applicant: Artemis Acquisition LLC, Sunnyvale, CA (US)

(72) Inventors: Richard V. De Caro, El Dorado Hills, CA (US); Danut Manea, Saratoga, CA (US); Yongliang Wang, Saratoga, CA (US); Stephen Trinh, San Jose, CA (US); Paul Hill, Southampton (GB)

(73) Assignee: Artemis Acquisition LLC, Sunnyvale, CA (US)

( * ) Notice: Subject to any disclaimer, the term of this patent is extended or adjusted under 35 U.S.C. 154(b) by 17 days.

This patent is subject to a terminal disclaimer.

(21) Appl. No.: 14/698,205

(22) Filed: Apr. 28, 2015

(65) Prior Publication Data

US 2015/0241956 A1  Aug. 27, 2015

Related U.S. Application Data

(63) Continuation of application No. 13/559,320, filed on Jul. 26, 2012, now Pat. No. 9,037,890.

(51) Int. Cl.
  *G06F 1/26* (2006.01)
  *G06F 1/32* (2006.01)
  (Continued)

(52) U.S. Cl.
  CPC ........... *G06F 1/3296* (2013.01); *G06F 1/3275* (2013.01); *G06F 1/3287* (2013.01);
  (Continued)

(58) Field of Classification Search
  CPC ...... G06F 1/26; G06F 1/3203; G06F 1/3206; G06F 1/3275; G06F 1/3287
  USPC .......................... 713/300, 320, 324; 711/103
  See application file for complete search history.

(56) References Cited

U.S. PATENT DOCUMENTS

| | | | |
|---|---|---|---|
| 9,037,890 B2 * | 5/2015 | De Caro | G06F 1/3275 711/103 |
| 2010/0188133 A1 | 7/2010 | Burdett | |
| 2012/0110248 A1 | 5/2012 | Deng et al. | |
| 2014/0032956 A1 | 1/2014 | De Caro et al. | |

FOREIGN PATENT DOCUMENTS

CN  101375229  6/2012

OTHER PUBLICATIONS

Atmel Corporation, "9-megabit 2.7-volt Minimum SPI Serial Flash Memory," AT26DF081A, 3600G-DFLASH, 40 pages (Jun. 2009).

(Continued)

*Primary Examiner* — Michael J Brown
(74) *Attorney, Agent, or Firm* — Fish & Richardson P.C.

(57) ABSTRACT

A memory device includes a voltage regulator, whose output provides a voltage supply for various other components of the memory device, including a command user interface. The memory device is placed into an ultra-deep power-down mode by providing to the memory device a software command, which causes the output of the voltage regulator to be disabled. To bring the memory device out of the ultra-deep power-down mode, a chip select signal is provided to the memory device, which includes a wake-up circuit that remains powered on even when the memory device is in the ultra-deep power-down mode. Receipt of the chip select signal while the memory device is in the ultra-deep power-down mode causes the output of the voltage regulator to be enabled, thereby providing power to the components that were completely powered down.

20 Claims, 3 Drawing Sheets

(51) Int. Cl.
*G11C 5/14* (2006.01)
*G11C 16/30* (2006.01)

(52) U.S. Cl.
CPC .............. *G11C 5/147* (2013.01); *G11C 16/30* (2013.01); *G06F 1/26* (2013.01); *G06F 1/3203* (2013.01); *G06F 1/3206* (2013.01); *G11C 5/148* (2013.01); *G11C 2216/30* (2013.01); *Y02B 60/1228* (2013.01); *Y02B 60/32* (2013.01)

(56) References Cited

OTHER PUBLICATIONS

PCT Authorized Officer, Norbert Wolff, International Search Report and Written Opinion issued in the PCT Application No. PCT/US2012/062770 dtd May 3, 2013, 11 pgs.

* cited by examiner

ULTRA-DEEP POWER-DOWN MODE FOR MEMORY DEVICES

CROSS-REFERENCES TO RELATED APPLICATIONS

This application is continuation of the U.S. patent application Ser. No. 13/559,320 filed on Jul. 26, 2012, which is incorporated by reference in its entirety for all purposes.

TECHNICAL FIELD

This disclosure relates to ultra-deep power-down modes for memory devices.

BACKGROUND

In many portable, battery-powered applications, power consumption is very important. Examples of such applications include, but are not limited to, cellular phones, pagers, camera recorders and laptops. These applications demand the lowest power consumption possible in order to prolong battery life and to enable the use of smaller, lower capacity batteries to reduce the application size, cost, and weight. Many of these applications use flash memory devices to store program code and, in some instances, the program code is copied into external or embedded microcontroller random access memory (RAM) after the application powers up. Since the code is shadowed from the flash memory into RAM, the flash memory does not need to be accessed until the next power cycle. In these instances, it can be desirable to put the flash memory device into as low a power mode as possible so as to consume the least amount of current.

Some applications completely remove power from the flash memory device to reduce the power consumption. However, doing so tends to increase the application complexity, as well as the cost, because an external power management device such as a low drop-out (LDO) regulator must be used to cut the power to the flash memory device.

SUMMARY

The present disclosure describes a memory device that can operate in an ultra-deep power-down mode in which only a very small amount of current is drawn from the device. In some implementations, the ultra-deep power-down mode may allow the average current consumption to be reduced to below one micro-amp (µA), and in some cases, as low as 300-400 nano-amps (nA).

In one aspect, a memory device includes a voltage regulator, whose output provides a voltage supply for various other components of the memory device, including a command user interface. The memory device is placed into an ultra-deep power-down mode by providing to the memory device a predetermined software command, which causes the output of the voltage regulator to be disabled. To bring the memory device out of the ultra-deep power-down mode, a chip select signal is provided to the memory device, which includes a wake-up circuit that remains powered on even when the memory device is in the ultra-deep power-down mode. Receipt of the chip select signal while the memory device is in the ultra-deep power-down mode causes the output of the voltage regulator to be enabled, thereby providing power to the components that were completely powered down.

Other aspects relate to methods and systems involving a memory device that is operable in an ultra-deep power-down mode.

Some implementations provide one or more of the following advantages. For example, the memory device can be placed into the ultra-deep power-down mode, and can exit the ultra-deep power-down mode, in a manner that saves a general purpose input/output (GP I/O) pin on the master host processor for other system functions. Also, placing the memory device into the ultra-deep power-down mode using a software opcode can provide greater flexibility. Furthermore, more complex, external power management device such as a low drop-out (LDO) regulator can be eliminated, thereby reducing overall costs. As some implementations may use fewer components, reliability may be enhanced as well.

Other aspects, features and advantages will be apparent from the following detailed description, the accompanying drawings and the claims.

DETAILED DESCRIPTION

Figure 1:
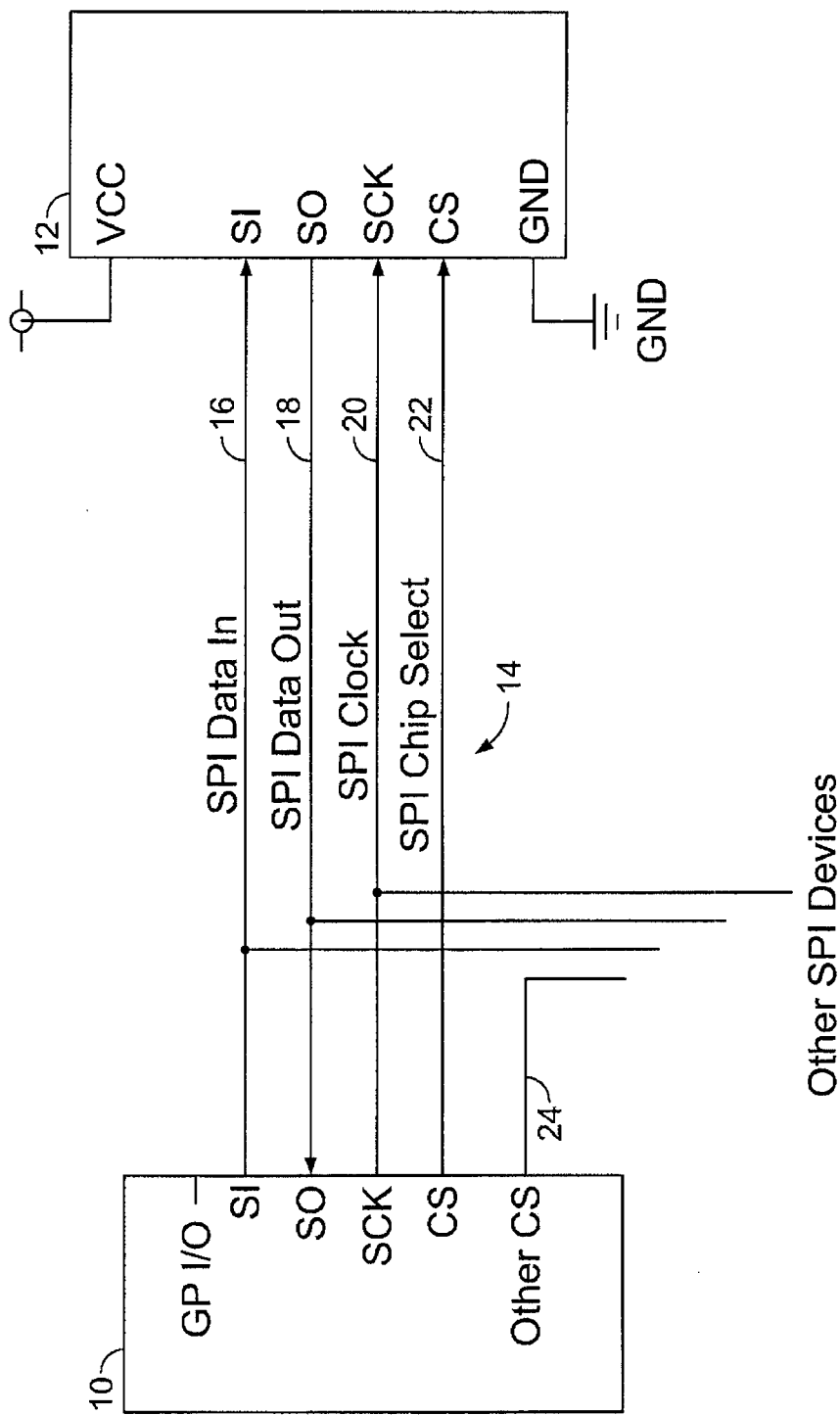
FIG. 1 is a simplified system connection between a host processor and a memory device.

As illustrated in FIG. 1, a master host device 10, such as a microcontroller, microprocessor, application-specific integrated circuit (ASIC) or application-specific standard product (ASSP), is coupled through a serial peripheral interface (SPI) bus 14 to a slave memory device 12, such as a flash or other memory device. The SPI bus 14 has various data and control lines including a SPI Data In line 16 for signals generated by the host processor 10 and received by the memory device 12, a SPI Data Out line 18 for signals generated by the memory device 12 and received by the host processor 10, a SPI clock line 20 for clock signals generated by the host processor 10 to synchronize data transfers between the devices 10, 12, and a SPI Chip Select line 22 for signals generated by the host processor 10 to select a particular slave or peripheral device. The SPI bus 14 may be coupled to additional SPI devices as well. In that case, additional chip select lines would be provided for the other SPI devices as well.

In some implementations, the memory device 12 is a serial-interface sequential access flash memory that can be used in a wide variety of digital voice, image, program code, and data storage applications. The techniques described in this document, however, can be used with other types of memory devices, including other types of non-volatile memory devices and other types of flash or SPI memory devices.

In the illustrated example, each of the host processor 10 and the memory device 12 has a SPI interface, including appropriate input/output pins for connection to the SPI bus 14. For example, the memory device 12 is enabled through a chip select pin (CS) and is accessed via a three-wire interface that includes a serial input (SI) pin, a serial output (SO) pin, and a serial clock (SCK) pin.

Asserting the CS pin selects the memory device 12. In the illustrated example, when the CS pin is de-asserted, the device is de-selected and normally is placed in a standby mode, and the output pin (SO) is in a high-impedance state. When the memory device 12 is deselected, data will not be accepted on the input pin (SI). A high-to-low transition on the CS pin is used to start an operation, and a low-to-high transition is used to end an operation.

The SCK pin is used to provide a clock to the memory device 12 and is used to control the flow of data to and from the device. In the illustrated example, command, address, and input data present on the SI pin is latched on the rising edge of the SCK signal, whereas output data on the SO pin is clocked out on the falling edge of the SCK signal.

The SI pin is used to shift data into the memory device 12. In the illustrated example, the SI pin is used for all data input including command and address sequences. Data on the SI pin is latched on the rising edge of the SCK signal. Data present on the SI pin is ignored whenever the memory device 12 is deselected (i.e., the CS pin is de-asserted).

The SO pin is used to shift data out from the memory device 12. In the illustrated example, data on the SO pin is clocked out on the falling edge of the SCK signal. The SO pin is in a high-impedance state whenever the device is deselected (i.e., when CS is de-asserted).

A VCC pin is used to supply the source voltage to the memory device 12, and a ground (GND) reference is connected to system ground in the illustrated implementation. The memory device 12 may include other pins as well.

The host processor 10 also includes a SI pin, a SO pin, a SCK pin and a CS pin. It also may include other pins, such as a general purpose input/output (GS I/O) pin and other chip select (CS) pins for selecting one of the other SPI devices.

Figure 2:
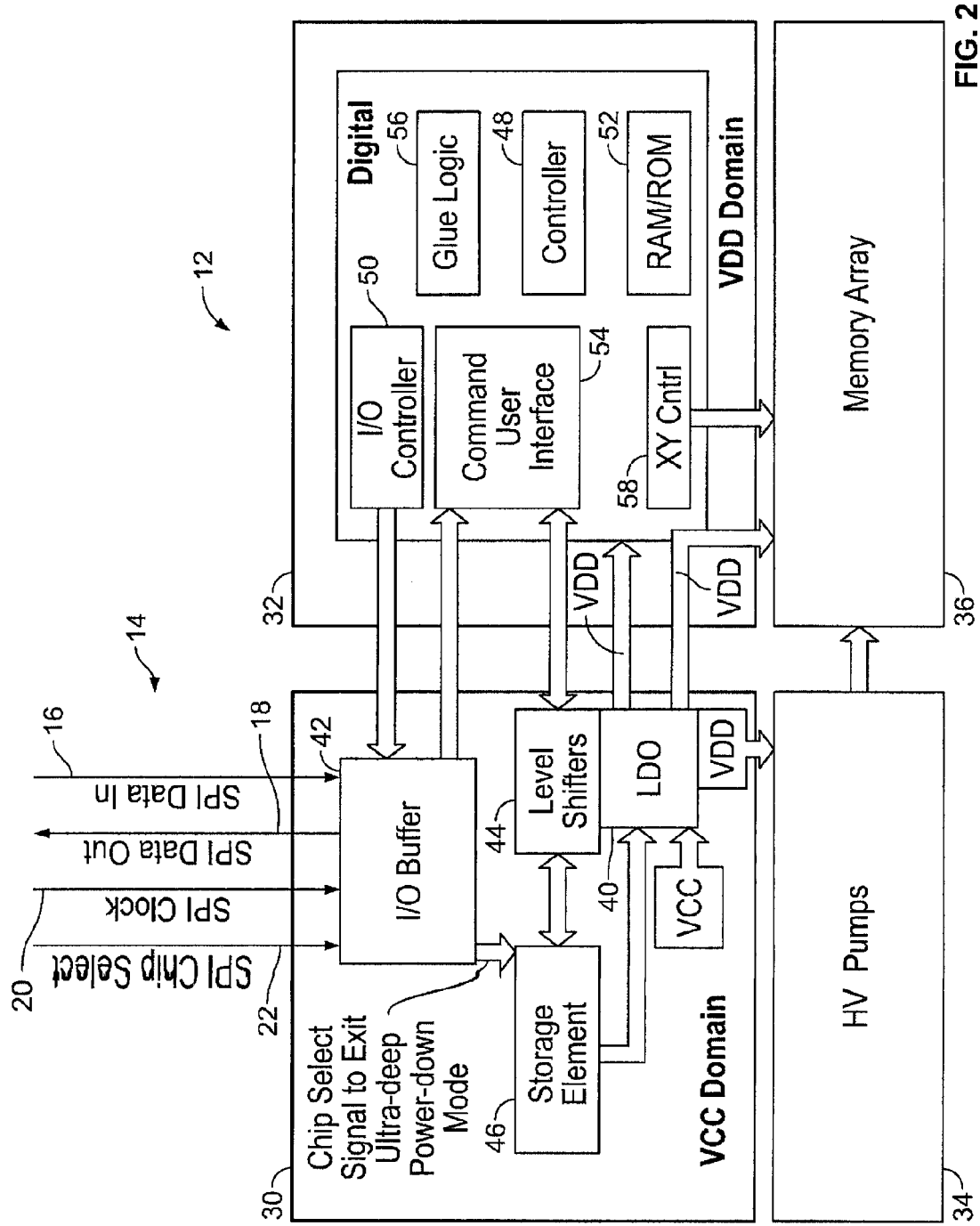
FIG. 2 is a block diagram showing various data processing units in an example memory device.

FIG. 2 illustrates various functional blocks that form part of the memory device 12 in some implementations and which may be implemented as part of a single integrated circuit memory device chip. In general, the memory device 12 can include VCC domain blocks (i.e., functional blocks or circuits that are powered by and operate using VCC power) 30, VDD domain blocks (i.e., functional blocks or circuits that are powered by and operated using a reduced power level VDD) 32, high voltage charge pumps 34 and a memory array 36. The memory device 12 itself can be powered by an external VCC power supply and includes a low drop-out (LDO) regulator 40 whose output serves as an internal on-chip voltage supply to provide the lower VDD voltage level to the VDD domain blocks 32, the high voltage charge pumps 34 and the memory array 36. Thus, the VDD domain blocks 32, the high voltage charge pumps 34 and the memory array 36 are powered by the LDO regulator 40.

In the illustrated example, the VCC domain blocks 30 also include an input/output buffer 42, level shifters 44, and a storage element 46, which stores the enabled/disabled state of the LDO regulator 40 and can be implemented, for example, as a latch such as a flip-flop circuit. Likewise, in the illustrated example, the VDD blocks 32 include various digital circuits such as a controller 48, an input/output controller 50, memory 52 (e.g., RAM and/or ROM), a command user interface (CUI) 54, glue logic 56 to interface between other logic units, and an XY controller 58 that interfaces with the memory array 36. The level shifters 44 are digital transfer devices that convert signals between the VCC and VDD supply domains. In some implementations, the VCC domain operates with 2.5 volts, whereas the VDD domain operates with 1.8 volts. The voltages may differ in other implementations.

Operation of the memory device 12 is controlled by instructions from the host processor 10. In the illustrated example, a valid instruction starts with the falling edge of the CS signal, followed by an 8-bit operation code (opcode) and the buffer or main memory address location.

In some applications, the memory device 12 stores program code, which may be copied into external RAM or RAM embedded in the host processor 10 after the application powers up. If the memory device 12 does not need to be accessed until the next power cycle, it may be desirable to put the memory device 12 into as low a power mode as possible so as to consume the least amount of current. There also may be other situations in which it is desirable to place the memory device 12 into a power-down mode. As explained below, the memory device 12 can be placed in an ultra-deep power-down mode in which only a very small amount of current is drawn from the device. In some implementations, the ultra-deep power-down mode allows the average current consumption to be reduced to well below one micro-amp (µA), and in some cases, as low as 300-400 nano-amps (nA). Thus, in some implementations, the disclosed techniques may reduce the current consumption by almost a factor of ten when the device is operated in the ultra-deep power-down mode. The actual power consumption in the ultra-deep power-down mode, however, may differ in other implementations.

The following paragraphs describe a protocol to enable an ultra-deep power-down mode in which the components of the memory device 12 that operate in the VDD domain are completely turned off. The protocol also enables the memory device 12 to exit the ultra-deep power-down mode.

Entering the ultra-deep power-down mode can be accomplished by providing a unique predetermined 8-bit command opcode from the host processor 10 to the buffer 42 over the SPI bus 14. After receiving the unique command opcode, the buffer 42 passes the unique command opcode to the command user interface 54. The command user interface 54 then passes the opcode to the level shifter 44 associated with decoding the command. The level shifter 44 converts the opcode to the appropriate VCC domain voltage level and transfers the opcode to the storage element 46, which as noted above, can be implemented, for example, as a flip-flop circuit. The storage element 46 then generates a signal to cause the output of the LDO regulator 40 to be disabled. Disabling the output of the LDO regulator 40 means that the VDD domain blocks 32 of the memory device 12, as well as the memory array 36 and high voltage charge pumps 34, are no longer powered. Thus, in the ultra-deep power-down mode, all components that normally are powered by the VDD voltage supply are completely powered down. By shutting down additional internal circuitry in the memory device 12, the ultra-deep power-down mode can allow the memory device 12 to consume less power compared to other low power or standby modes.

Since almost all active circuitry is shut down in the ultra-deep power-down mode to conserve power, the input/output controller 50 and the command user interface 54 are completely powered down during the ultra-deep power-down mode. Since any additional data clocked into the memory device 12 after the memory device enters the ultra-deep power-down mode (and before it exits that mode) will be ignored, all subsequent commands will be ignored (until the device exits the ultra-deep power-down mode). On the other hand, as all commands are ignored, the ultra-deep power-down mode can be used as an extra protection mechanism against program and erase operations.

When the memory device 12 is in the ultra-deep power-down mode, the device continues to be powered by the VCC voltage, such that the VCC domain blocks 30 (including the storage element 46, the LDO regulator 40 and I/O buffers 42) remain connected to the VCC voltage. Nevertheless, in this state, the LDO regulator 40, which can be implemented as a relatively small circuit, can have a very small amount of leakage, thereby helping keep the overall power consumption of the memory device 12 at a very low level during the ultra-deep power-down mode.

Figure 3:
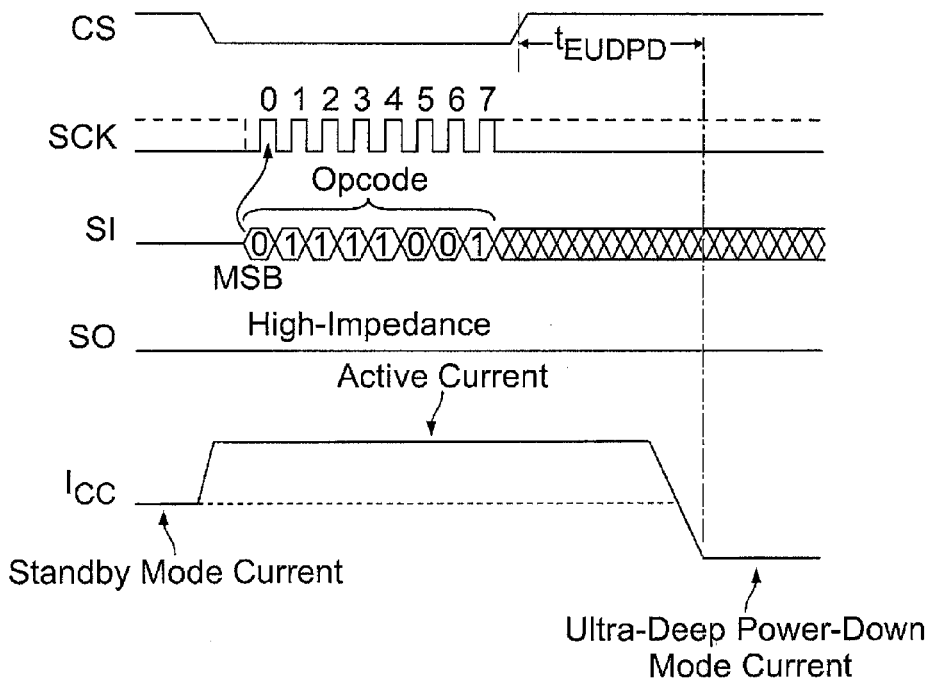
FIG. 3 is an example timing diagram for various signals to place the memory device in an ultra-deep power-down mode.

As illustrated by the timing diagram of FIG. 3, entering the ultra-deep power-down mode can be accomplished by asserting the CS pin on the memory device 12, clocking in the unique predetermined command opcode, and then de-asserting the CS pin. The complete opcode should be clocked in before the CS pin is de-asserted. When the CS pin is de-asserted, the memory device 12 enters the ultra-deep power-down mode within a time "tEUDPD." In some implementations, the ultra-deep power-down command will be ignored if an internally self-timed operation, such as a program or erase cycle, is in progress.

As noted above, the input/output controller 50 and the command user interface 54 are completely powered down during the ultra-deep power-down mode and, thus, all opcode commands are ignored by the memory device 12 when it is in the ultra-deep power-down mode. This means that, in the illustrated example, an opcode command (i.e., a software instruction) sent over the SPI Data Out line 18 of the SPI bus 14 cannot be used to bring the memory device 12 out of the ultra-deep power-down mode.

Instead, to wake the memory device 12 and bring it out of the ultra-deep power-down mode, the signal on the SPI Chip Select line 22 of the SPI bus 14 is toggled, and the signal is received at the CS pin of the memory device 12. When the device 12 is in the ultra-deep power-down mode, the buffer 42 passes the chip select signal directly to the storage element 46, which generates a signal to cause the output of the LDO regulator 40 to be enabled. Enabling the output of the LDO regulator 40 provides the VDD voltage to the various VDD domain blocks 32, as well as the high voltage charge pumps 34 and the memory array 36, thus restoring the memory device 12 to standby mode. Thus, although the memory device 12 is placed into the ultra-deep power-down mode using a software command (i.e., the opcode), the memory device is brought out of the ultra-deep power-down mode using only hardware features of the memory device 12.

Figure 4:
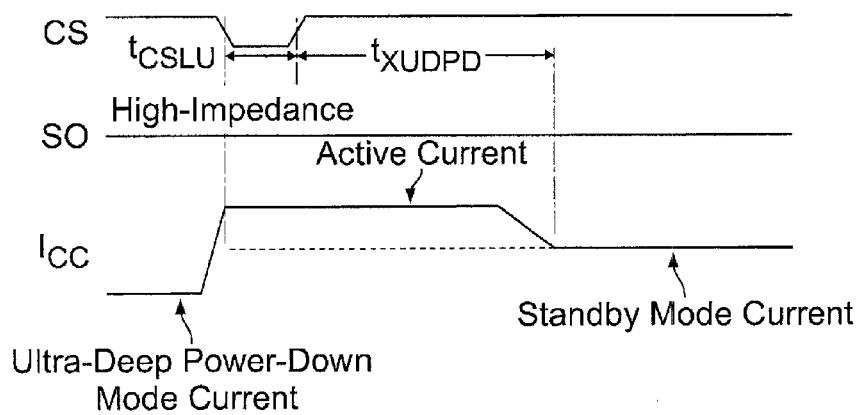
FIG. 4 is an example timing diagram for various signals for exiting the ultra-deep power-down mode.

As illustrated by the example of FIG. 4, to exit from the ultra-deep power-down mode, the SPI Chip Select line 22 of the SPI bus 14 is pulsed to assert the CS pin of the memory device 12. After waiting a minimum time "tCSLU," the CS pin of the memory device 12 is de-asserted again.

To facilitate simple software development, a dummy byte opcode can be provided over the SPI Data Out line 18 while the CS pin is being pulsed to cause the memory device 12 to exit the ultra-deep power-down mode. The dummy byte opcode is simply ignored by the memory device 12 since it is still in ultra-deep power-down mode. After the CS pin of the memory device 12 is de-asserted, the device 12 will exit from the ultra-deep power-down mode and will return to the standby mode within a time "tXUDPD." In the illustrated example, if the CS pin is re-asserted before the "tXUDPD" time has elapsed in an attempt to start a new operation, then that operation will be ignored and nothing will be performed in response to that operation. Instead, the system waits for the device 12 to return to the standby mode before normal command operations can be resumed.

Other implementations are within the scope of the claims.

What is claimed is:

1. A method comprising:
   powering a first component included in a memory device at a first voltage level;
   providing, to a voltage regulator included in the memory device, power at the first voltage level;
   outputting, using the voltage regulator, power at a second voltage level;
   powering a second component included in the memory device at the second voltage level;
   receiving a first instruction at the memory device to go into a power-down mode;
   in response to receiving the instruction to go into the power-down mode, disabling power output by the voltage regulator; and
   while the first component remains powered on, powering down the second component by disabling power output by the voltage regulator.

2. The method of claim 1, wherein the second voltage level is different from the first voltage level.

3. The method of claim 1, wherein the second voltage level is same as the first voltage level.

4. The method of claim 1, wherein receiving the first instruction comprises:
   receiving a software command at the memory device;
   forwarding a signal corresponding to the software command to a storage element included in the memory device; and
   in response to the signal corresponding to the software command, controlling, by the storage element, the voltage regulator to disable power output by the voltage regulator.

5. The method of claim 1, further comprising:
   receiving a signal asserting a chip select pin of the memory device, the signal configured to remain asserted for a time period when the second component is powered down; and
   based on the signal asserting the chip select pin for the time period, re-enabling power output by the voltage regulator.

6. The method of claim 1, further comprising:
   receiving a signal and a dummy byte code when the memory device is in the power-down mode; and
   based on receiving the signal and the dummy byte code, re-enabling power output by the voltage regulator.

7. A device comprising:
   a first component that is configured to operate at a first voltage level;
   a second component that is configured to operate at a second voltage level; and
   circuitry that is configured to perform operations comprising:
      receiving power at the first voltage level at an input to the device;
      providing power at the first voltage level to the first component;
      providing power at the second voltage level to the second component;
      receiving, at the input to the device, an instruction to go into power-down mode; and
      in response to receiving the instruction to go into power-down mode, disabling provision of power at the second voltage level to the second component,
   wherein the second component is configured to be powered down based on disabling the provision of power at the second voltage level in response to receiving the instruction to go into power-down mode, while the first component is configured to remain powered on.

8. The device of claim 7, wherein the second voltage level is different from the first voltage level.

9. The device of claim 7, wherein the second voltage level is same as the first voltage level.

10. The device of claim 7, wherein the circuitry comprises:
a command user interface that is configured to perform operations comprising:
processing a software command received at the device; and
forwarding a signal corresponding to the software command to a storage element included in the circuitry; and
the storage element that is configured to perform operations comprising:
receiving the signal corresponding to the software command from the command user interface; and
in response to the signal corresponding to the software command, controlling a voltage regulator to disable provision of power at the second voltage level by the voltage regulator.

11. The device of claim 10, wherein the circuitry includes a level shifter that is configured to perform operations comprising:
receiving, from the command user interface, the signal corresponding to the software command at the second voltage level; and
forwarding, to the storage element, the signal corresponding to the software command at the first voltage level.

12. The device of claim 7, wherein the circuitry includes a voltage regulator that is configured to provide the provide the power at the second voltage level and is disabled in response to receiving the instruction to go into power-down mode, and wherein the first component includes a storage element that is configured to perform operations comprising:
receiving a signal asserting a chip select pin, the signal configured to remain asserted for a time period when the second component is powered down; and
based on the signal asserting the chip select pin for the time period, controlling the voltage regulator to re-enable power output by the voltage regulator.

13. The device of claim 12, further including an input/output buffer that is configured to perform operations comprising:
receiving the signal asserting the chip select pin that is provided at an input of the device; and
providing the signal asserting the chip select pin to the storage element.

14. The device of claim 7, wherein the circuitry includes a voltage regulator that is configured to provide the provide the power at the second voltage level and is disabled in response to receiving the instruction to go into power-down mode, and wherein the first component includes a storage element that is configured to perform operations comprising:
receiving a signal and a dummy byte code when the device is in the power-down mode; and
based on receiving the signal and the dummy byte code, controlling the voltage regulator to re-enable power output by the voltage regulator.

15. The device of claim 7, wherein the second component includes one of a memory array or a high voltage charge pump.

16. A system comprising:
a bus;
a processor; and
memory coupled to the bus and the processor, the memory configured to store instructions, which, when executed by the processor, cause the processor to perform operations comprising:
causing a memory selection signal to be asserted on the bus, the memory selection signal selecting a memory component;
transferring on the bus an instruction, the instruction configured to transition the memory component into a power-down mode;
causing a wake signal to be asserted on the memory component, the wake signal configured to remain asserted for a time period when the memory component is in the power-down mode;
determining that the time period has expired; and
responsive to expiration of the time period, causing the memory component to power up.

17. The system of claim 16, wherein causing a wake signal to be asserted comprises:
asserting a chip select signal for the time period when the memory component is in the power-down mode; and
based on asserting the chip select signal for the time period, powering up the memory component.

18. The system of claim 16, wherein causing a wake signal to be asserted comprises:
asserting a signal and a dummy byte code when the memory component is in the power-down mode; and
based on asserting the signal and the dummy byte code, powering up the memory component.

19. The system of claim 16, wherein causing a wake signal to be asserted comprises:
asserting a dummy byte code when the memory component is in the power-down mode; and
based on asserting the dummy byte code, powering up the memory component.

20. The system of claim 16, wherein transferring the instruction on the bus comprises:
transferring on the bus a software command that is configured to transition the memory component into a power-down mode without affecting other components.

* * * * *